(12) United States Patent
Jen et al.

(10) Patent No.: US 10,998,323 B2
(45) Date of Patent: May 4, 2021

(54) DYNAMIC RANDOM ACCESS MEMORY

(71) Applicant: Winbond Electronics Corp., Taichung (TW)

(72) Inventors: Kai Jen, Taichung (TW); Ting-Ting Ke, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/531,110

(22) Filed: Aug. 4, 2019

(65) Prior Publication Data
US 2020/0321342 A1    Oct. 8, 2020

(30) Foreign Application Priority Data
Apr. 2, 2019  (TW) ................................. 108111730

(51) Int. Cl.
*H01L 29/12* (2006.01)
*H01L 27/108* (2006.01)

(52) U.S. Cl.
CPC .. *H01L 27/10885* (2013.01); *H01L 27/10802* (2013.01); *H01L 27/10876* (2013.01)

(58) Field of Classification Search
None
See application file for complete search history.

(56) References Cited

U.S. PATENT DOCUMENTS

| | | | |
|---|---|---|---|
| 7,456,458 B2* | 11/2008 | Wang | H01L 27/108 257/296 |
| 8,389,360 B2* | 3/2013 | Abbott | H01L 27/10876 438/259 |
| 8,482,047 B2 | 7/2013 | Abbott et al. | |
| 2006/0038259 A1* | 2/2006 | Thomas | H01L 21/3081 257/618 |
| 2013/0187279 A1* | 7/2013 | Surthi | H01L 21/743 257/773 |
| 2014/0175555 A1* | 6/2014 | Lee | H01L 21/76224 257/368 |

* cited by examiner

*Primary Examiner* — Hung K Vu
(74) *Attorney, Agent, or Firm* — JCIPRNET

(57) ABSTRACT

A dynamic random access memory (DRAM) including a substrate, transistors, bit line sets, conductive structures, and word line sets is provided. The transistors are arranged on the substrate in an array. Each transistor includes a first conductive layer, a second conductive layer, and a third conductive layer. The bit line sets are disposed in parallel along a Y direction and pass through the transistors. Each bit line set includes a first bit line and a second bit line electrically connected to the first conductive layer of each transistor respectively. The conductive structures are located in the transistors. The conductive structures are electrically connected to the second conductive layer of the transistors and the substrate. The word line sets are disposed in parallel along an X direction. Each word line set includes a first word line and a second word line located on sidewalls of each transistor respectively.

10 Claims, 13 Drawing Sheets

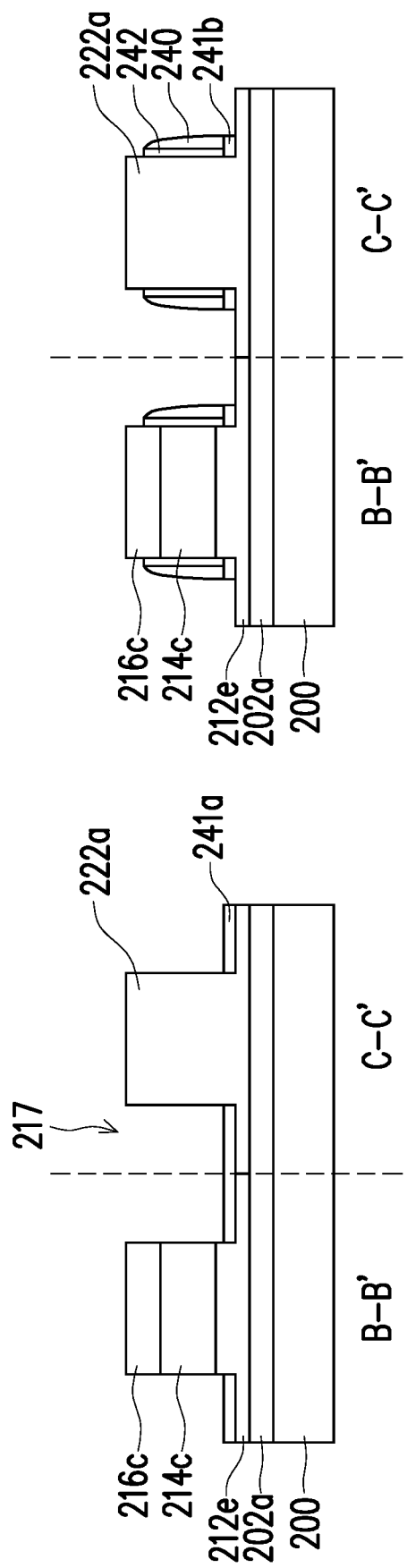

DYNAMIC RANDOM ACCESS MEMORY

CROSS-REFERENCE TO RELATED APPLICATION

This application claims the priority benefit of Taiwan application serial no. 108111730, filed on Apr. 2, 2019. The entirety of the above-mentioned patent application is hereby incorporated by reference herein and made a part of this specification.

BACKGROUND OF THE INVENTION

Field of the Invention

The invention relates to a memory, and particularly relates to a dynamic random access memory.

Description of Related Art

In a dynamic random access memory arranged in $4F^2$, a vertical transistor having a buried word line and a capacitor stacked on the vertical transistor constitute a memory cell region. The structure of such vertical transistor may produce floating body effect, which will lead to problems such as threshold voltage fluctuation, memory effect, or hysteresis effect. Thus, the reliability of the product is reduced.

SUMMARY OF THE INVENTION

The invention provides a dynamic random access memory including a substrate, a plurality of transistors, a plurality of bit lines, a plurality of conductive structures, and a plurality of word lines. The plurality of transistors are arranged on the substrate in an array. Each of the transistors includes a first conductive layer, a second conductive layer, and a third conductive layer sequentially from bottom to top. The plurality of bit lines are disposed on the substrate in parallel along a Y direction and electrically connected to the first conductive layer of each of the transistors. The plurality of conductive structures are located in the plurality of transistors. Each of the conductive structures is electrically connected to the second conductive layer of each of the transistors and the substrate. The plurality of word lines are disposed on the substrate in parallel along an X direction. Each of the word lines covers sidewalls of each of the transistors.

Based on the above, in the dynamic random access memory of the present invention, by forming the conductive structure in the vertical transistor, the second conductive layer in the vertical transistor is electrically connected to the substrate. Thus, the charges accumulated in the second conductive layer can be exported to improve the floating body effect produced by the structure of the vertical transistor. Therefore, in the dynamic random access memory of the present invention, the problems such as threshold voltage fluctuation, memory effect, or hysteresis effect caused by the floating body effect can be avoided, so as to improve the reliability of the whole product.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2L to FIG. 2O are schematic cross-sectional views showing a manufacturing process along a line B-B' and a line C-C' of FIG. 1.

DESCRIPTION OF THE EMBODIMENTS

Figure 1:
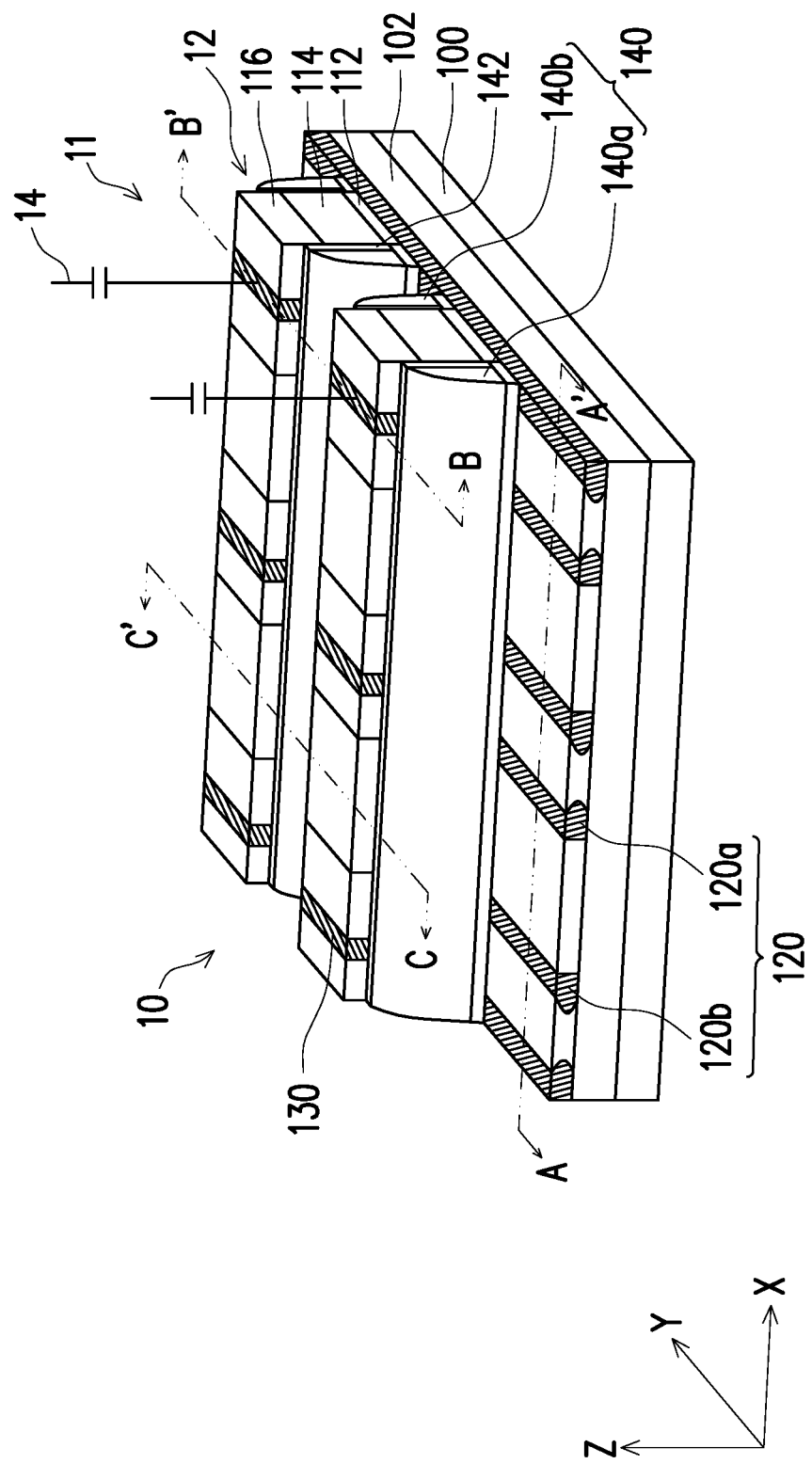
FIG. 1 is a schematic three-dimensional view of a dynamic random access memory according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic three-dimensional view of a dynamic random access memory according to an embodiment of the invention. In the present embodiment, a dynamic random access memory 10 of FIG. 1 may be a dynamic random access memory arranged in a $4F^2$ array, for example. For the sake of clarity, some components are omitted.

Referring to FIG. 1, in the present embodiment, the dynamic random access memory 10 includes a plurality of memory cells 11. The memory cells 11 are located on a substrate 100, and each of the memory cells 11 includes a transistor 12 and a capacitor 14, wherein the capacitor 14 is located on the transistor 12 and electrically connected to the transistor 12. In the present embodiment, the transistor 12 is a vertical transistor, for example. Hereinafter, some components are further described in detail.

Referring to FIG. 1, in the present embodiment, the dynamic random access memory 10 includes the substrate 100, the plurality of transistors 12, a plurality of bit line sets 120, a plurality of conductive structures 130, and a plurality of word line sets 140, for example.

Specifically, in some embodiments, the plurality of transistors 12 are arranged on the substrate 100 in an array. An insulating layer 102 may be included between the substrate 100 and the transistor 12, for example. Each of the transistors 12 includes a first conductive layer 112, a second conductive layer 114, and a third conductive layer 116 sequentially from bottom to top. The plurality of bit line sets 120 are disposed on the substrate 100 in parallel along a Y direction and pass through the plurality of transistors 12. Each of the bit line sets 120 includes a first bit line 120a and a second bit line 120b electrically connected to the first conductive layer 112 of each of the transistors 12 respectively. The plurality of conductive structures 130 are located in the plurality of transistors 12. Each of the conductive structures 130 is electrically connected to the second conductive layer 114 of each of the transistors 12 and the substrate 100. The plurality of word line sets 140 are disposed on the substrate 100 in parallel along an X direction. Each of the word line sets 140 includes a first word line 140a and a second word line 140b located on sidewalls of each of the transistors 12 respectively. Each of the transistors 12 further includes a gate dielectric layer 142 on the sidewalls, and the gate dielectric layer 142 is located between the first word line 140a and the transistor 12 and between the second word line 140b and the transistor 12.

In some embodiments, the first conductive layer 112 and the third conductive layer 116 have a first conductivity type, and the second conductive layer 114 and the conductive structure 130 have a second conductivity type. In other words, the first conductive layer 112 and the third conductive layer 116 have the same conductivity type, and the second conductive layer 114 and the conductive structure 130 have the same conductivity type.

In some embodiments, each of the conductive structures 130 has at least one contact surface with the second conductive layer 114 of each of the transistors 12. In a particular embodiment, each of the conductive structures 130 passes through each of the transistors 12 along a Z direction, for example. That is, in some embodiments, a top surface of each of the conductive structures 130 is coplanar with a top surface of the third conductive layer 116 of each of the transistors 12, for example. In other embodiments, the top surface of each of the conductive structures 130 is coplanar with a top surface of the second conductive layer 114 of each of the transistors 12, for example. In other embodiments, the top surface of each of the conductive structures 130 is coplanar with a top surface of the first conductive layer 112 of each of the transistors 12, for example. In the present invention, as long as each of the conductive structures 130 has at least one contact surface with the second conductive layer 114 of each of the transistors 12, the conductive structures 130 can electrically connect the second conductive layer 114 and the substrate 100.

FIG. 2A to FIG. 2K are schematic cross-sectional views showing a manufacturing process along a line A-A' of FIG. 1. FIG. 2L to FIG. 2O are schematic cross-sectional views showing a manufacturing process along a line B-B' and a line C-C' of FIG. 1.

Figure 2B:
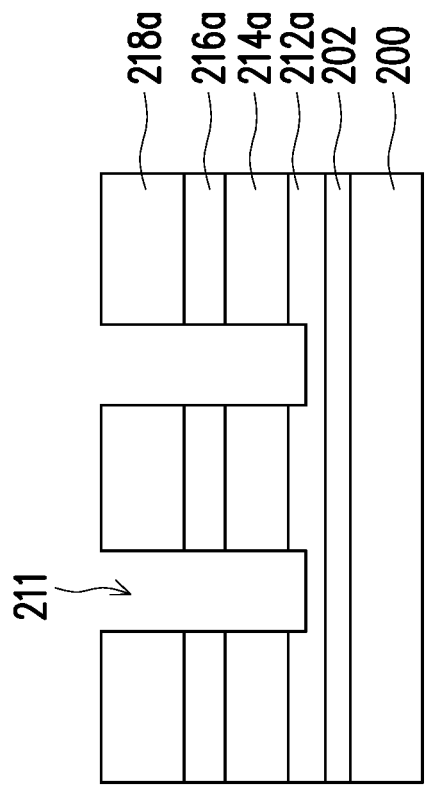
FIG. 2A to FIG. 2K are schematic cross-sectional views showing a manufacturing process along a line A-A' of FIG. 1.
Figure 2A:
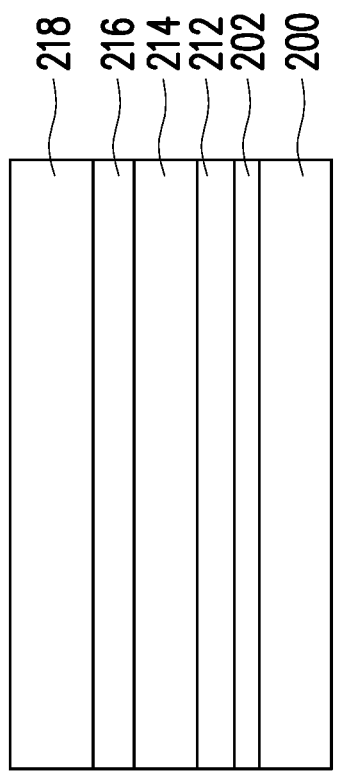

Referring to FIG. 2A, in the present embodiment, the steps of the method of manufacturing the dynamic random access memory are as follows. First, a substrate 200 is provided. In some embodiments, the substrate 200 may be a semiconductor substrate, for example. In the present embodiment, the substrate 200 is a P-type silicon substrate as an example. In the present embodiment, the substrate 200 may be a silicon on insulator substrate. That is, a thermal oxidation process may be performed on the substrate 200, for example, so as to form an insulating layer 202 on the substrate 200.

Then, referring to FIG. 2A, a first conductive layer 212, a second conductive layer 214, and a third conductive layer 216 are sequentially formed on the insulating layer 202. In some embodiments, the first conductive layer 212, the second conductive layer 214, and the third conductive layer 216 may be doped polycrystalline silicon layers, for example. In the present embodiment, the first conductive layer 212 and the third conductive layer 216 may be N-type polycrystalline silicon layers, for example, the implanted dopant may be phosphorus or arsenic, for example, and the doping concentration may be between $1\times10^{13}$ cm$^{-2}$ and $1\times10^{16}$ cm$^{-2}$, for example. The second conductive layer 214 may be a P-type polycrystalline silicon layer, for example, the implanted dopant may be boron, for example, and the doping concentration may be between $1\times10^{12}$ cm$^{-2}$ and $1\times10^{14}$ cm$^{-2}$, for example. The following embodiments will be illustrated with this example, but the invention is not limited thereto. That is, in other embodiments, the first conductive layer 112 and the third conductive layer 116 may be P-type polycrystalline silicon layers, for example, and the second conductive layer 114 may be a N-type polycrystalline silicon layer, for example. In some embodiments, the first conductive layer 212, the second conductive layer 214, and the third conductive layer 216 may be formed by stacking a monocrystalline silicon substrate opposite to the insulating layer 202 of the substrate 200, for example. Then, a heating process is performed to bond the monocrystalline silicon substrate onto the insulating layer 202. Thereafter, a doping or implanting process is performed to form the first conductive layer 212, the second conductive layer 214, and the third conductive layer 216 sequentially from bottom to top on the monocrystalline silicon substrate, but the invention is not limited thereto. In some embodiments, a heating treatment may be optionally performed after each of the conductive layers is sequentially formed on the insulating layer 202, so as to activate the dopants in each of the conductive layers. Then, referring to FIG. 2A, an insulating layer 218 is formed on the third conductive layer 216. In some embodiments, the insulating layer 218 may be a silicon oxide layer, for example, and a forming method may be a chemical vapor deposition method, for example. In some embodiments, a thickness of the insulating layer 218 is between 50 nm and 200 nm, for example.

Then, referring to FIG. 2A and FIG. 2B, a photolithography etching process is performed to form a plurality of trenches 211 on the substrate 200. In some embodiments, the steps of forming the plurality of trenches 211 are as below. First, a patterned photoresist layer (not shown) having a predetermined pattern is formed on the insulating layer 218. Then, the exposed insulating layer 218, the third conductive layer 216, the second conductive layer 214, and the first conductive layer 212 are removed using the patterned photoresist layer as a mask to form the plurality of trenches 211 extended along the Y direction on the substrate 100. Thereafter, the patterned photoresist layer is removed. In the present embodiment, the exposed first conductive layer 212 is not completely removed. That is, there is still a portion of the first conductive layer 212 under the bottom surface of the trench 211. In other words, the bottom surface of the trench 211 is slightly lower than the top surface of the first conductive layer 212a and slightly higher than the bottom surface of the first conductive layer 212a. In some embodiments, a distance between the bottom surface of the trench 211 and the top surface of the first conductive layer 212a is between 80 nm and 100 nm, for example. In some embodiments, a ratio of the distance between the bottom surface of the trench 211 and the top surface of the first conductive layer 212a to the distance between the bottom surface of the trench 211 and the bottom surface of the first conductive layer 212a is between 300 nm and 320 nm, for example.

Figure 2C:
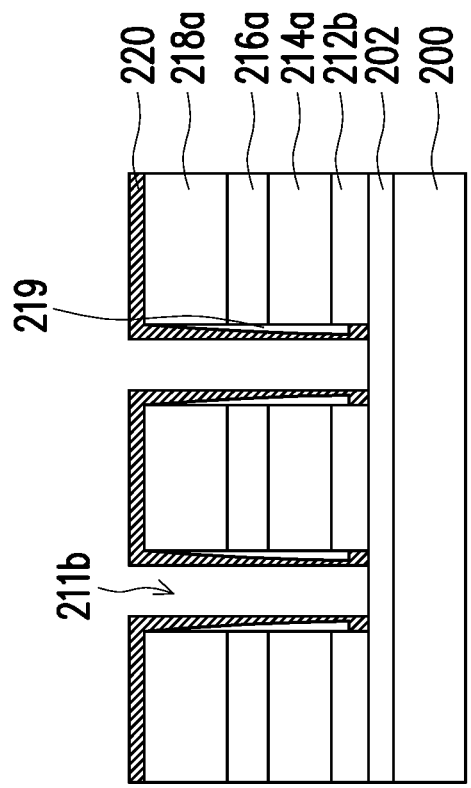

Then, referring to FIG. 2B and FIG. 2C, an insulating layer 219 is formed on a portion of sidewalls of the trench 211a. In some embodiments, the steps of forming the insulating layer 219 are as below. First, an insulating material layer (not shown) is conformally formed on the top surface of the insulating layer 218a and in the trench 211. A material of the insulating material layer may be, for example, a nitride material, such as silicon nitride. Then, the insulating material layer located on the top surface of the insulating layer 218a and on the bottom surface of the trench 211 is removed to form the insulating layer 219 on the sidewalls of the trench 211. Thereafter, the remaining first conductive layer 212a under the bottom surface of the trench 211 is continuously removed until the top surface of the insulating layer 202 is exposed by the trench 211a. In the present embodiment, the insulating layer 219 is formed on the sidewalls of the trench 211, and then the remaining first conductive layer 212a under the bottom surface of the trench 211 is removed. Thus, the insulating layer 219 only covers the sidewalls of the insulating layer 218a, the third conductive layer 216a, and the second conductive layer 214a, and a portion of the sidewalls of the first conductive layer 212b. That is, the trench 211a also exposes a portion of the sidewalls of the first conductive layer 212b near the bottom surface of the trench 211a.

Figure 2D:
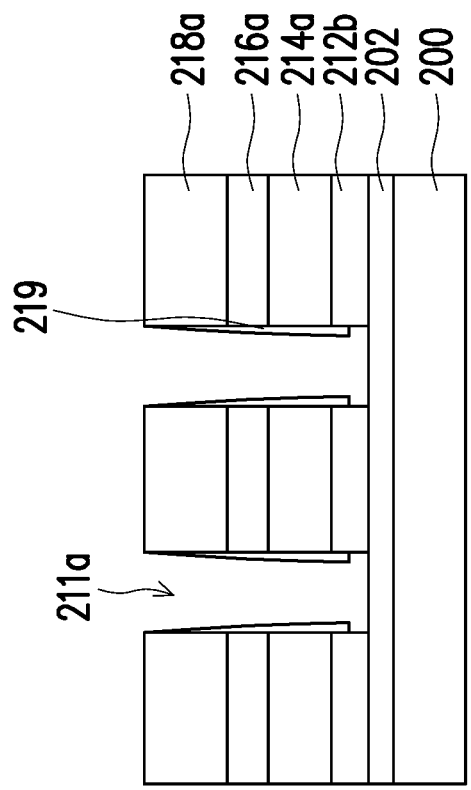

Then, referring to FIG. 2C and FIG. 2D, a conductive layer 220 is formed to cover the top surface of the insulating layer 218a and the sidewalls and the bottom surface of the trench 211a. Particularly, the conductive layer 220 is conformally formed on the top surface of the insulating layer 218a, the surface of the insulating layer 219, a portion of the sidewalls of the first conductive layer 212b, and the exposed top surface of the insulating layer 202, for example.

Figure 2F:
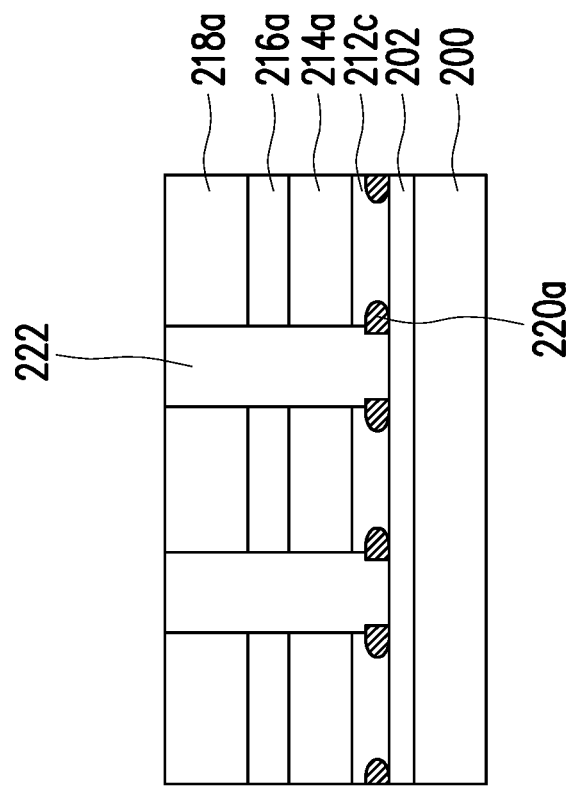
Figure 2E:
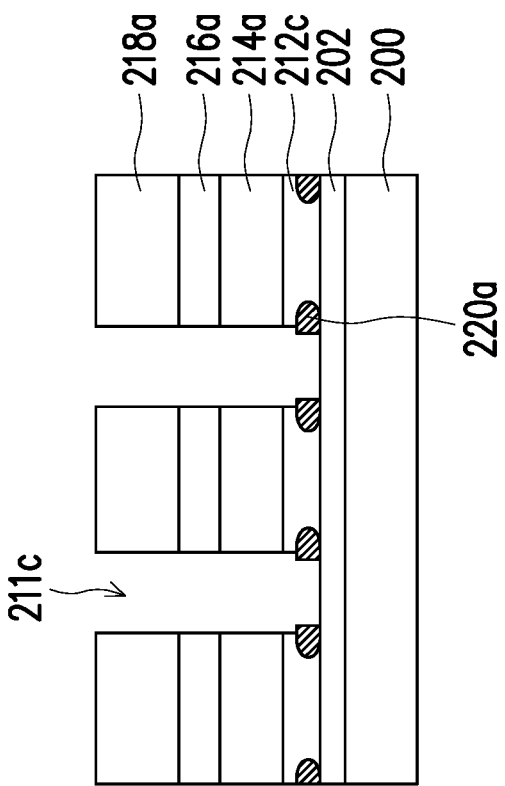

Then, referring to FIG. 2D and FIG. 2E, a rapid thermal annealing process is performed. In the present embodiment, the conductive layer 220 in direct contact with the first conductive layer 212b is converted into a silicide thereof after the rapid thermal annealing process, so as to form a buried bit line 220a. That is, the formed bit line 220a is buried in the first conductive layer 212c, and a portion of the bit line 220a protrudes from the sidewalls of the first conductive layer 212c. In the present embodiment, a material of the conductive layer 220 may be cobalt, for example. The formed buried bit line 220a is a cobalt silicide. Before performing the subsequent steps, the insulating layer 219 and the conductive layer 220 not reacting with the first conductive layer 212b in the trench 211b are removed. That is, only the formed bit line 220a is left in the trench 211c, and a portion of the bit line 220a protrudes from the sidewalls of the first conductive layer 212c.

Then, referring to FIG. 2E and FIG. 2F, a nitride layer 222 is formed in the trench 211c. In the present embodiment, the steps of forming the nitride layer 222 is, for example, to form a nitride material layer (not shown) first, so as to fill the trench 211c and cover the top surface of the insulating layer 218a. Thereafter, a planarization process is performed until the top surface of the insulating layer 218a is exposed.

Figure 2H:
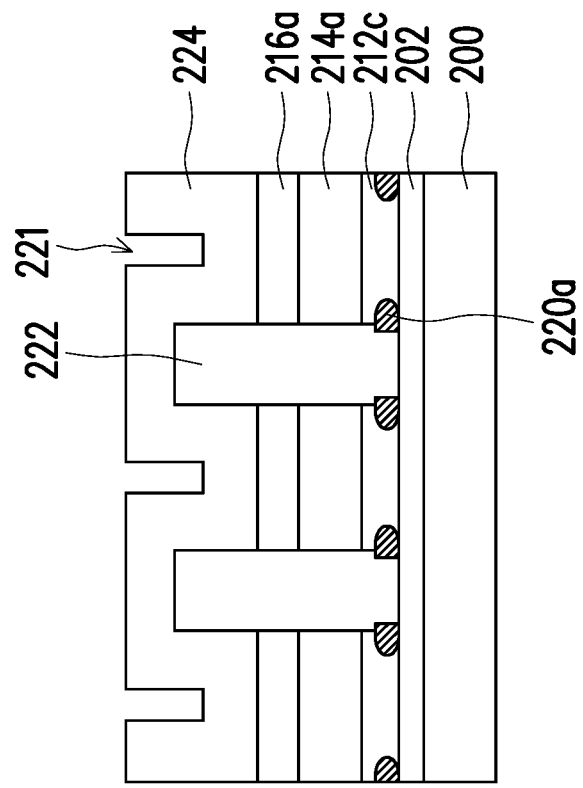
Figure 2G:
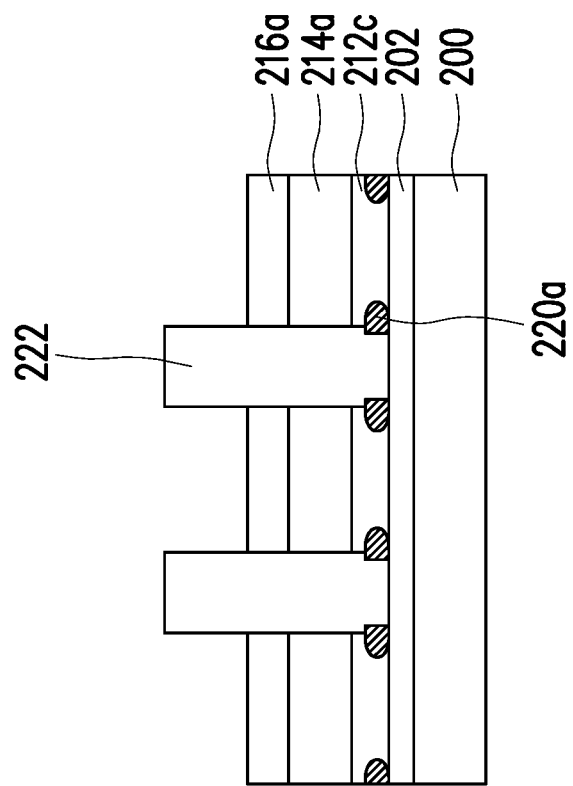

Then, referring to FIG. 2F and FIG. 2G, the insulating layer 218a is removed. At this time, the top surface of the nitride layer 222 is higher than the top surface of the third conductive layer 216a.

Then, referring to FIG. 2G and FIG. 2H, a dielectric layer 224 is formed on the top surfaces of the nitride layer 222 and the third conductive layer 216a. In the present embodiment, the dielectric layer 224 is conformally formed on the top surfaces of the nitride layer 222 and the third conductive layer 216a, for example. Since there is a height difference between the top surface of the nitride layer 222 and the top surface of the third conductive layer 216a, the top surface of the dielectric layer 224 may be a continuous concave-convex structure, for example. As shown in FIG. 2H, the dielectric layer 224 on the top surface of the third conductive layer 216a has an opening 221.

Figure 2J:
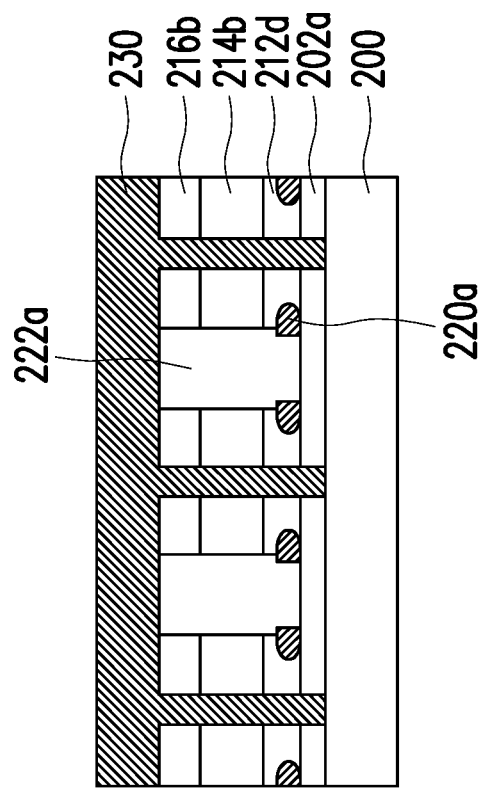
Figure 2I:
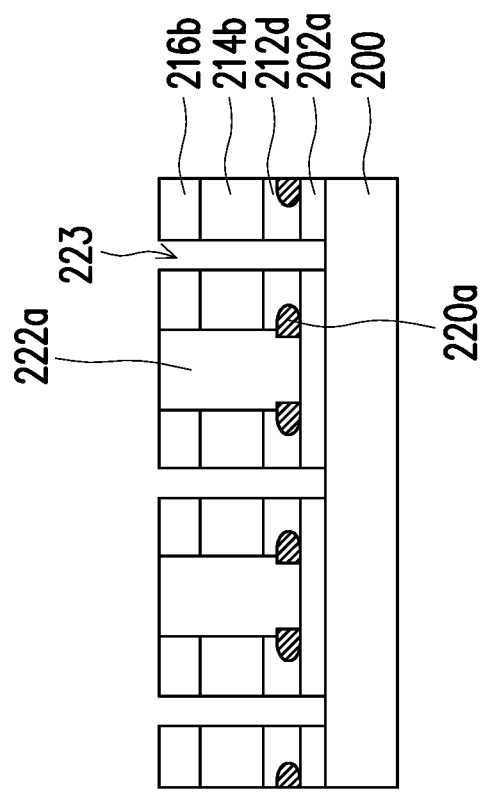

Then, referring to FIG. 2H and FIG. 2I, an etching process is performed to remove a portion of the dielectric layer 224, a portion of the third conductive layer 216a, a portion of the second conductive layer 214a, and a portion of the first conductive layer 212c, so as to form an opening 223. The opening 223 exposes the top surface of the substrate 200.

Particularly, in the present embodiment, a material of the dielectric layer 224 is silicon oxide, for example, and a material of the nitride layer 222 is silicon nitride, for example. By means of the high etching selectivity ratio of silicon oxide to silicon nitride, the etching process is performed using the nitride layer 222 as an etching stop layer until the top surface of the substrate 200 is exposed by the opening 223. In some embodiments, the top surface of the nitride layer 222 will be slightly removed. Thus, the top surface of the nitride layer 222 is not necessarily a flat surface, but the invention is not limited thereto. The etching process is performed before performing the subsequent steps, and the third conductive layer 216b is used as an etching stop layer, so as to remove a portion of the nitride layer 222 until the top surface of the remaining nitride layer 222a is flush with the top surface of the third conductive layer 216b.

Then, referring to FIG. 2I and FIG. 2J, a conductive layer 230 is formed on the substrate 200. In the present embodiment, the conductive layer 230 covers the top surface of the third conductive layer 216b and fills the opening 223. It should be mentioned that, the conductive layer 230 should be the polycrystalline silicon having the same conductivity type as that of the second conductive layer 214b.

Figure 2K:
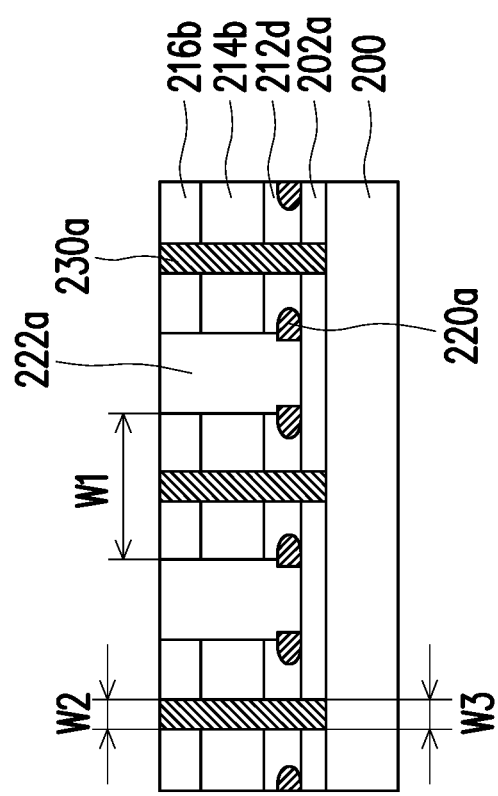

Then, referring to FIG. 2J and FIG. 2K, a planarization process is performed until the top surfaces of the third conductive layer 216b and the nitride layer 222a are exposed. At this point, the remaining conductive layer 230 is a conductive structure 230a.

Referring to FIG. 2K, in the present embodiment, the conductive structure 230a sequentially passes through the third conductive layer 216b, the second conductive layer 214b, the first conductive layer 212d, and the insulating layer 202a from top to bottom, and the conductive structure 230a is in contact with the substrate 200. Thus, the conductive structure 230a can be used to electrically connect the second conductive layer 214b and the substrate 200.

In some embodiments, two adjacent nitride layers 222a have a width W1 therebetween in the X direction. In other words, the transistor formed in the subsequent steps has the first width W1 in the X direction. In the present embodiment, the top surface of the conductive structure 230a has a second width W2, and the bottom surface of the conductive structure 230a has a third width W3, wherein the first width W1 is greater than the second width W2, and the first width W1 is greater than the third width W3. In the present embodiment, the second width W2 is the same as the third width W3.

Figure 2M:
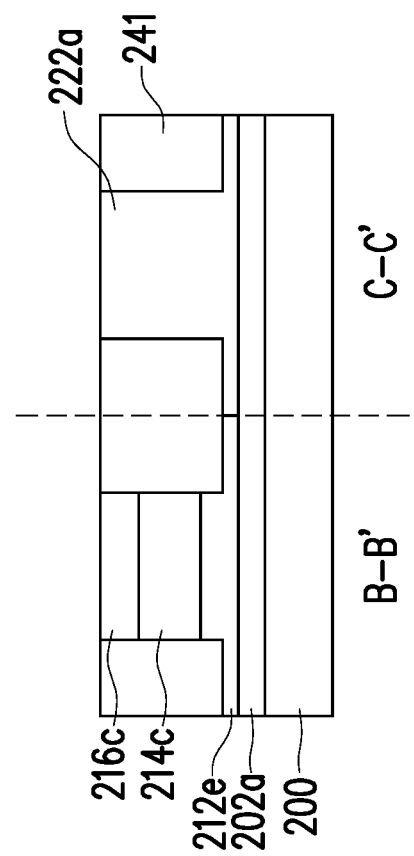
Figure 2L:
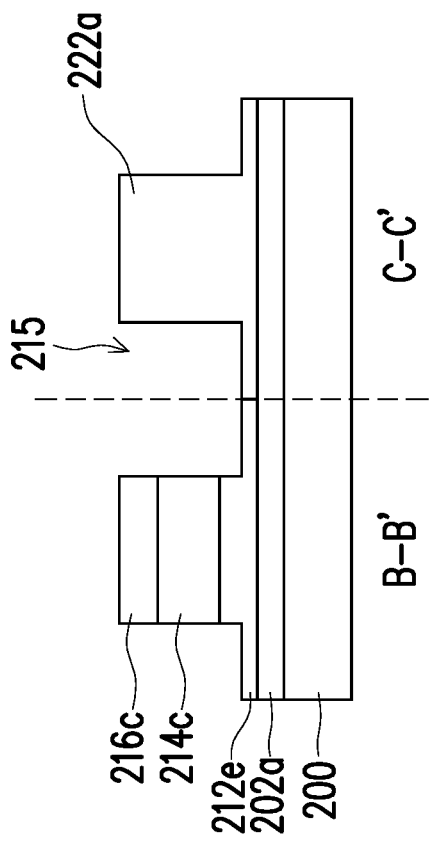

Then, referring to FIG. 2K and FIG. 2L, a photolithography etching process is performed to form a plurality of trenches 215 on the substrate 200. The steps of forming the plurality of trenches 215 are similar to the steps of forming the plurality of trenches 211. The difference between the two is that the trenches 211 are extended along the Y direction, and the trenches 215 are extended along the X direction. It should be noted that, there is still a portion of the first conductive layer 212d under the bottom surface of the trench 215. In other words, the bottom surface of the trench 215 is slightly lower than the top surface of the first conductive layer 212e and slightly higher than the bottom surface of the first conductive layer 212e.

Then, referring to FIG. 2L and FIG. 2M, an insulating layer 241 is formed to fill the trench 215.

Then, referring to FIG. 2M and FIG. 2N, a portion of the insulating layer 241 is removed to form a plurality of trenches 217 on the substrate 200. The remaining insulating layer 241a may be used to electrically isolate the bit line 220a and the word line formed in the subsequent steps, as long as the thickness of the insulating layer 241a can provide the insulation between the bit line 220a and the word line.

Then, referring to FIG. 2N and FIG. 2O, a gate dielectric layer 242 and a gate layer 240 are sequentially formed on the sidewalls of the trench 217. In the present embodiment, a gate dielectric material layer is formed on the sidewalls of the trench 217 first. Then, a gate material layer is formed on the gate dielectric material layer. Thereafter, an anisotropic etching process is performed to define the gate layer 240. The gate layer 240 is located on the insulating layer 241b. In the present embodiment, the gate dielectric layer 242 and the gate layer 240 can be used as the word line of the dynamic random access memory of the present invention. At this point, the preparation of the transistor, the word line, and the bit line in the dynamic random access memory of the present invention is completed.

Particularly, referring to FIG. 2O, in the present embodiment, the third conductive layer 216c, the second conductive layer 214c, and the first conductive layer 212e constitute the transistor of the present invention, and each transistor has a word line set on the sidewall. Each of the word line sets includes two word lines, and each of the word lines includes a gate dielectric layer 242 and a gate layer 240. The gate dielectric layer 242 is located between the transistor and the gate layer 240 to electrically isolate the transistor and the gate layer 240.

It should be noted that, referring to FIG. 2K, in the present embodiment, the conductive structure 230a sequentially passes through the third conductive layer 216b, the second conductive layer 214b, the first conductive layer 212d, and the insulating layer 202a from top to bottom (in the Z direction), and the conductive structure 230a is in contact with the substrate 200. Thus, the conductive structure 230a can be used to electrically connect the second conductive layer 214b and the substrate 200. That is, in the present embodiment, the top surface of the conductive structure 230a is coplanar with the top surface of the third conductive layer 216b, but the invention is not limited thereto. On the other hand, in the present embodiment, the second width W2 of the top surface of the conductive structure 230a is the same as the third width W3 of the bottom surface of the conductive structure 230a in the X direction.

Further, in the dynamic random access memory of the present embodiment, the second conductive layer 214b can be electrically connected to the substrate 200 by the design of the conductive structure 230a. Thus, the charges accumulated in the second conductive layer 214b can be exported to improve the floating body effect produced by the structure of the vertical transistor. Thereby, the problems such as threshold voltage fluctuation, memory effect, or hysteresis effect caused by the floating body effect can be avoided, so as to improve the reliability of the whole product.

FIG. 3 to FIG. 7 are schematic cross-sectional views of dynamic random access memories according to some embodiments of the invention.

In FIG. 3 to FIG. 7, the material and the forming methods of a substrate 300, an insulating layer 302, a first conductive layer 312, a second conductive layer 314, a third conductive layer 316, a bit line set 320, and a nitride layer 322 are the same as or similar to that of the substrate 200, the insulating layer 202, the first conductive layer 212, the second conductive layer 214, the third conductive layer 216, the bit line set 120, and the nitride layer 222, and will not be repeated here. Only the differences are described below.

Figure 3:
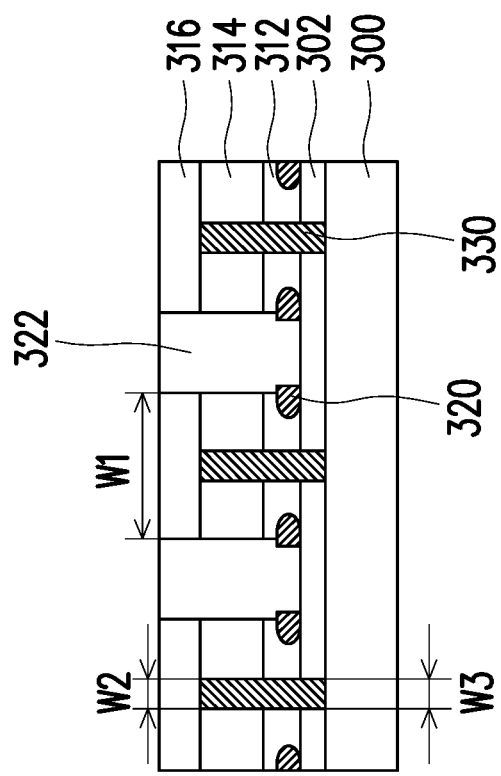

Referring to FIG. 3, in the present embodiment, a top surface of the conductive structure 330 is coplanar with a top surface of the second conductive layer 314. On the other hand, in the present embodiment, the second width W2 of the top surface of the conductive structure 330 is the same as the third width W3 of the bottom surface of the conductive structure 330 in the X direction.

Figure 4:
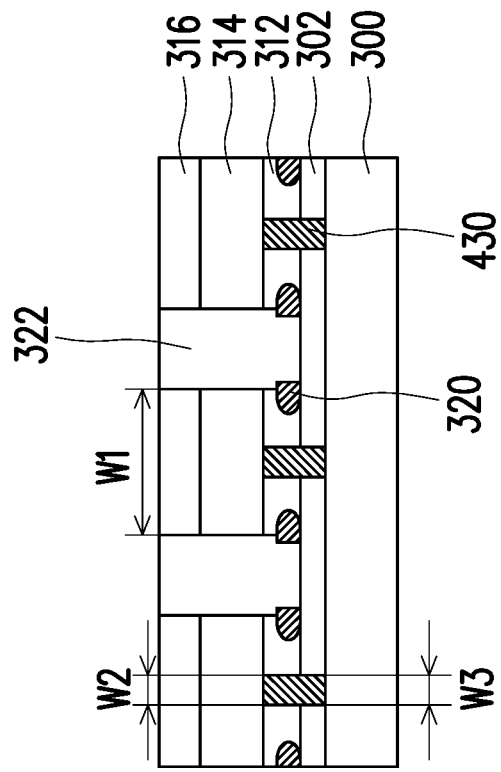
FIG. 3 to FIG. 7 are schematic cross-sectional views of dynamic random access memories according to some embodiments of the invention.

Referring to FIG. 4, in the present embodiment, a top surface of the conductive structure 430 is coplanar with the top surface of the first conductive layer 312. On the other hand, in the present embodiment, the second width W2 of the top surface of the conductive structure 430 is the same as the third width W3 of the bottom surface of the conductive structure 430 in the X direction.

Figure 5:
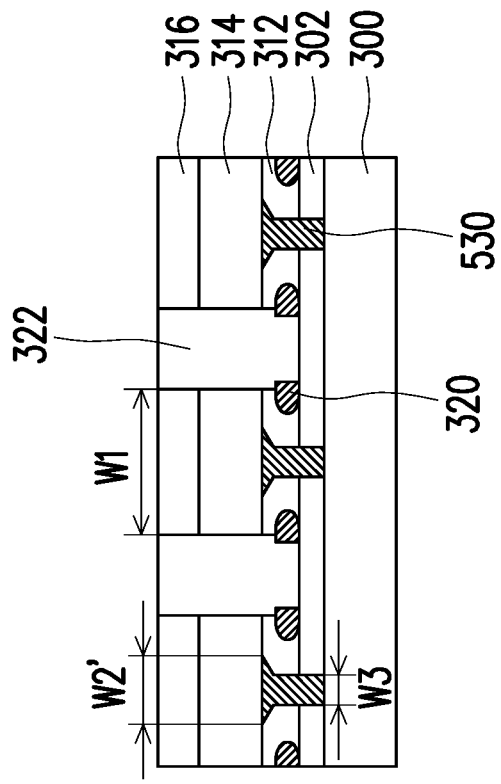

Referring to FIG. 5, in the present embodiment, a top surface of the conductive structure 530 is coplanar with the top surface of the first conductive layer 312. On the other hand, in the present embodiment, a second width W2' of the top surface of the conductive structure 530 is different from the third width W3 of the bottom surface of the conductive structure 530 in the X direction. As shown in FIG. 5, the second width W2' of the top surface of the conductive structure 530 is greater than the third width W3 of the bottom surface of the conductive structure 530, and the conductive structure 530 has a funnel shape.

Figure 6:
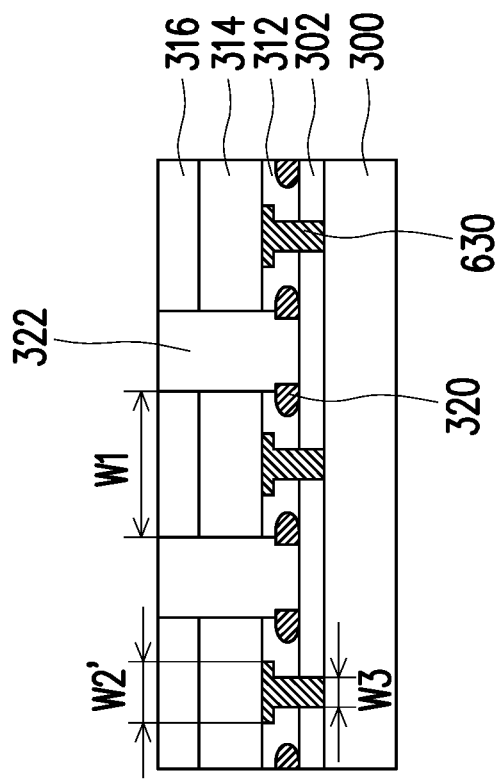

Referring to FIG. 6, in the present embodiment, a top surface of the conductive structure 630 is coplanar with the top surface of the first conductive layer 312. On the other hand, in the present embodiment, the second width W2' of the top surface of the conductive structure 630 is different from the third width W3 of the bottom surface of the conductive structure 630 in the X direction. As shown in FIG. 6, the second width W2' of the top surface of the conductive structure 630 is greater than the third width W3 of the bottom surface of the conductive structure 630, and the conductive structure 630 has a T-shape.

Figure 7:
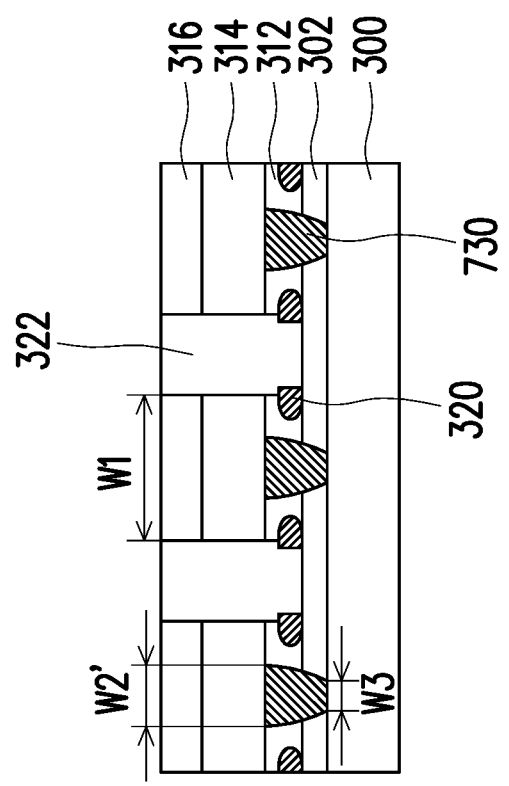

Referring to FIG. 7, in the present embodiment, a top surface of the conductive structure 730 is coplanar with the top surface of the first conductive layer 312. On the other hand, in the present embodiment, the second width W2' of the top surface of the conductive structure 730 is different from the third width W3 of the bottom surface of the conductive structure 730 in the X direction, but the invention is not limited thereto. As shown in FIG. 7, the second width W2' of the top surface of the conductive structure 730 is greater than the third width W3 of the bottom surface of the conductive structure 730, and the conductive structure 730 has an inverted trapezoidal shape.

Figure 8:
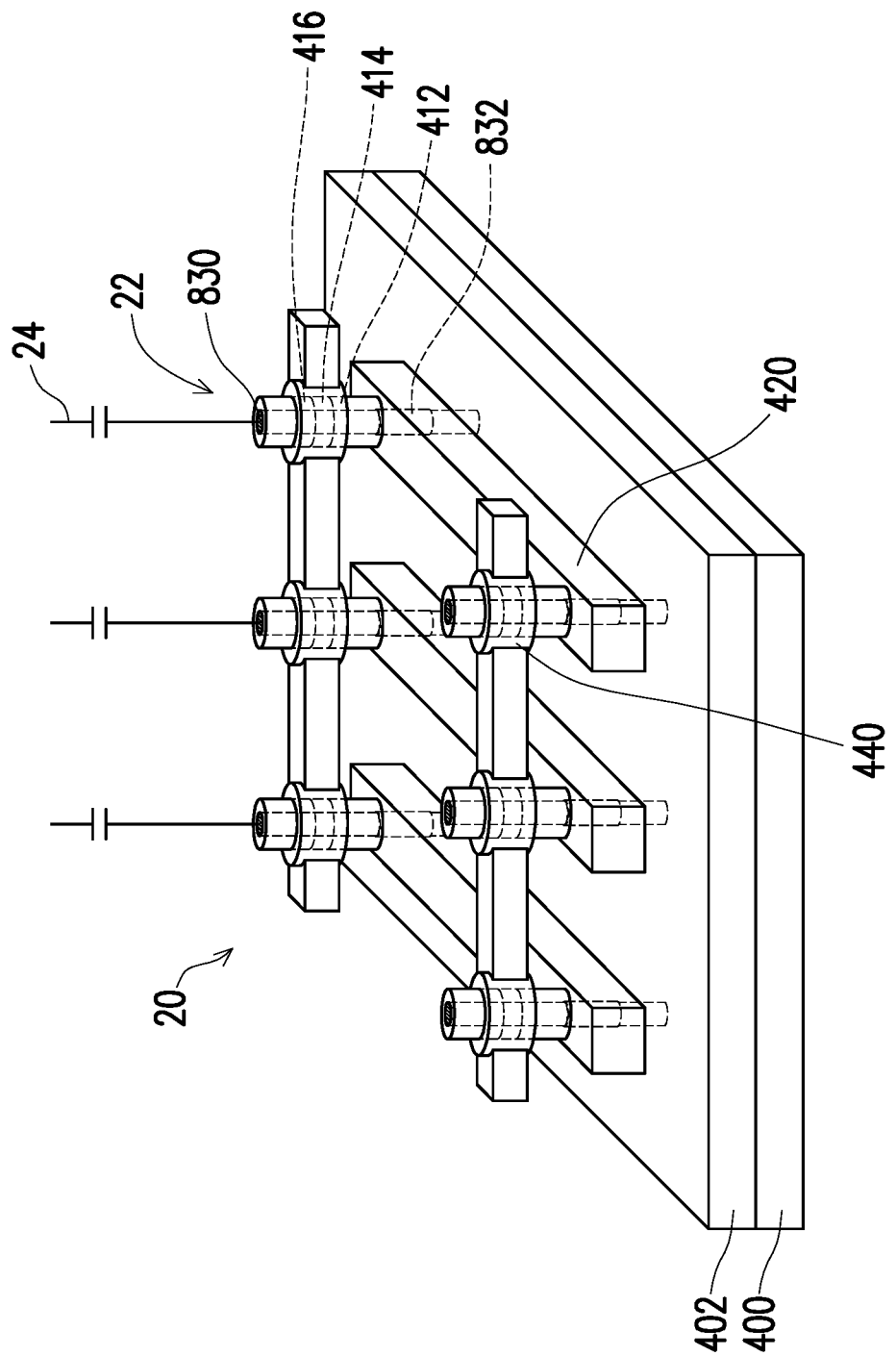
FIG. 8 is a schematic three-dimensional view of a dynamic random access memory according to another embodiment of the invention.

FIG. 8 is a schematic three-dimensional view of a dynamic random access memory according to another embodiment of the invention.

Referring to FIG. 8, in the present embodiment, a dynamic random access memory 20 includes a substrate 400, a plurality of transistors 22, a plurality of bit lines 420, a plurality of conductive structures 830, and a plurality of word lines 440, for example.

Specifically, in some embodiments, the plurality of transistors 22 are arranged on the substrate 400 in an array. An insulating layer 402 may be included between the substrate 400 and the transistor 22, for example. Each of the transistors 22 includes a first conductive layer 412, a second conductive layer 414, and a third conductive layer 416 sequentially from bottom to top. The plurality of bit lines 420 are disposed on the substrate 400 in parallel along the Y direction and electrically connected to the first conductive layer 412 of each of the of transistors 22. The plurality of conductive structures 830 are located in the plurality of transistors 22. Each of the conductive structures 830 is electrically connected to the second conductive layer 414 of each of the transistors 22 and the substrate 400. The plurality of word lines 440 are disposed on the substrate 400 in parallel along the X direction. Each of the word lines 440 covers the sidewalls of the each of the transistors 22. In the present embodiment, the dynamic random access memory 20 further includes a capacitor 24. The capacitor 24 is located on the transistor 22 and electrically connected to the transistor 22.

It should be noted that, in the present embodiment, the transistor 22 has a cylindrical shape. The conductive structure 830 also has a cylindrical shape, and the conductive structure 830 sequentially passes through the third conductive layer 416, the second conductive layer 414, the first conductive layer 412, and the insulating layer 402 of the transistor 22 from top to bottom, so that the second conductive layer 414 of the transistor 22 is electrically connected to the substrate 400. In addition, an insulating layer 832 is included between the conductive structure 830 and the bit line 420. In the present invention, the thickness or the forming method of the insulating layer 832 is not particularly limited, as long as the conductive structure 830 is insulated from the bit line 420.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A dynamic random access memory, comprising:
    a substrate;
    a plurality of transistors, arranged on the substrate in an array, each of the plurality of transistors comprising a first conductive layer, a second conductive layer, and a third conductive layer sequentially from bottom to top;
    a plurality of bit line sets, disposed on the substrate in parallel along a Y direction and passing through the plurality of transistors, each of the plurality of bit line sets comprising a first bit line and a second bit line electrically connected to the first conductive layer of each of the plurality of transistors respectively;
    a plurality of conductive structures, located in the plurality of transistors, each of the plurality of conductive structures being electrically connected to the second conductive layer of each of the plurality of transistors and the substrate; and
    a plurality of word line sets, disposed on the substrate in parallel along an X direction, each of the plurality of word line sets comprising a first word line and a second word line located on sidewalls of each of the plurality of transistors respectively.

2. The dynamic random access memory according to claim 1, wherein the first conductive layer and the third conductive layer have a first conductivity type, and the second conductive layer and the conductive structure have a second conductivity type.

3. The dynamic random access memory according to claim 1, wherein each of the plurality of conductive structures has at least one contact surface with the second conductive layer of each of the plurality of transistors.

4. The dynamic random access memory according to claim 1, wherein a top surface of each of the plurality of conductive structures is coplanar with a top surface of the third conductive layer of each of the plurality of transistors.

5. The dynamic random access memory according to claim 1, wherein a top surface of each of the plurality of conductive structures is coplanar with a top surface of the second conductive layer of each of the plurality of transistors.

6. The dynamic random access memory according to claim 1, wherein a top surface of each of the plurality of conductive structures is coplanar with a top surface of the first conductive layer of each of the plurality of transistors.

7. The dynamic random access memory according to claim 1, wherein each of the plurality of transistors has a first width in the X direction, a top surface of each of the plurality of conductive structures has a second width, and a bottom surface of each of the plurality of conductive structures has a third width, wherein the first width is greater than the second width, the first width is greater than the third width, and the second width is the same as or different from the third width.

8. A dynamic random access memory, comprising:
    a substrate;
    a plurality of transistors, arranged on the substrate in an array, each of the plurality of transistors comprising a first conductive layer, a second conductive layer, and a third conductive layer sequentially from bottom to top;
    a plurality of bit lines, disposed on the substrate in parallel along a Y direction and electrically connected to the first conductive layer of each of the plurality of transistors;
    a plurality of conductive structures, located in the plurality of transistors, each of the plurality of conductive structures being electrically connected to the second conductive layer of each of the plurality of transistors and the substrate; and
    a plurality of word lines, disposed on the substrate in parallel along an X direction, each of the plurality of word line covering sidewalls of each of the plurality of transistors.

9. The dynamic random access memory according to claim 8, wherein the first conductive layer and the third conductive layer have a first conductivity type, and the second conductive layer and the conductive structure have a second conductivity type.

10. The dynamic random access memory according to claim 8, wherein each of the plurality of conductive structures has at least one contact surface with the second conductive layer of each of the plurality of transistors.

* * * * *